Oct. 14, 1969 T. T. FJÄLLBRANT 3,473,140
FILTER CIRCUIT WITH RECIPROCAL IMPEDANCE BRANCHES
Filed July 7, 1967

INVENTOR
Tore Torstensson Fjällbrant
BY Hane and Baxley
Attorneys 3,473,140
FILTER CIRCUIT WITH RECIPROCAL IMPEDANCE BRANCHES Tore Torstensson Fjällbrant, Staborg, Fjaras, Sweden, assignor to Telefonaktiebolaget L M Ericsson, Stockholm, Sweden, a corporation of Sweden Filed July 7, 1967, Ser. No. 651,782
Claims priority, application Sweden, Aug. 12, 1966, 10,981/66
Int. Cl. H03f 3/04
U.S. Cl. 330—31 5 Claims

ABSTRACT OF THE DISCLOSURE

A filter circuit includes an amplifier element such as a transistor or a triode vacuum tube having input, output and common terminals. The output terminal is connected by a first impedance branch to an output point. The common terminal is also connected by a second impedance branch which has an impedance that is the reciprocal of the impedance of the first branch to the output point.

The present invention refers to a filter arrangement for signals with such a frequency that amplifiers with electronic tubes or transistors can be used. An object of the invention is to provide a filter which, in comparison with conventional filters, has the advantage of having, without connected reciprocal inductances or cross links, a phase function which is linear within a considerably larger frequency range than normal, and at the same time has amplitude function which is horizontal within the pass band and has a change of the amplitude function but not of the phase function when there is a variation of the signal amplitudes in two branches within the filter. This phenomenon is interesting, particularly in connection with so-called phase linear filters used, for example, in systems for the transmission of frequency modulated signals. By varying the amplitude relation between the two signals it is possible to vary the width of the frequency band, within which the amplitude function of the filter is horizontal or flat, without influencing the phase function of the filter. In filter arrangements of a band pass type according to the invention there is furthermore the advantage that a possible non-linearity in the phase can easily be eliminated by adjusting the resonance frequencies of certain circuits.

A filter arrangement constructed in accordance with the invention is characterized by a link comprising an amplifier element and two reciprocal impedance branches outgoing from different points on the output side of the amplifier element and connected to a common point at their ends remote from the amplifier element and arranged to transmit two signals with a mutual phase difference of 180° towards the output side of the filter arrangement.

Figure 1:
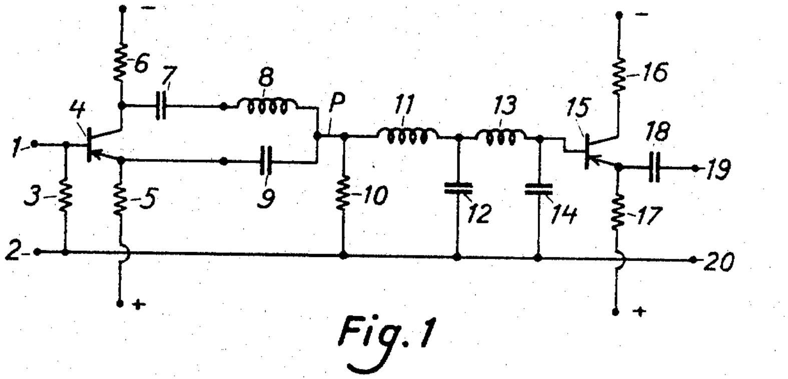
Figure 2:
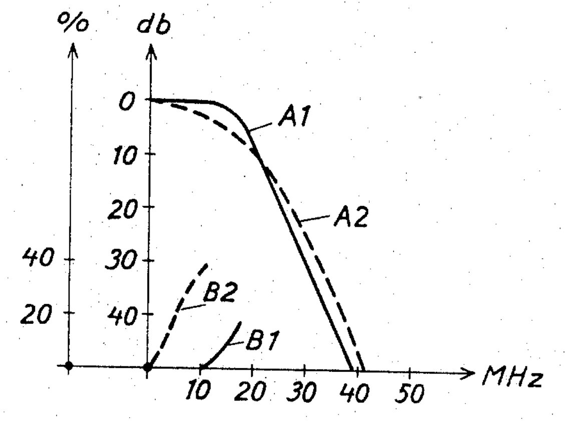
Figure 3:
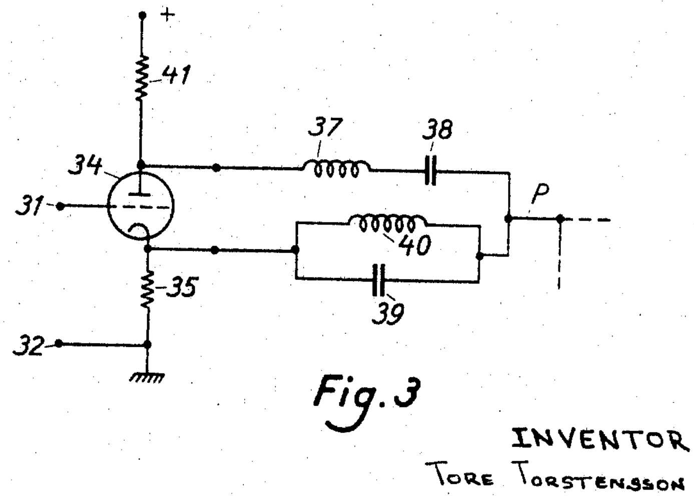

The invention will be more fully described in connection with the accompanying drawing, where FIG. 1 shows a filter arrangement with a transistor, and an inductance branch and a capacitance branch, FIG. 2 shows some curves of amplitude functions and group transit time distortions, and FIG. 3 shows a filter arrangement with an electronic tube and a series resonance circuit and a parallel resonance circuit.

The filter arrangement according to FIG. 1 has a link comprising a transistor 4 and two branches extending from the output side of the transistor 4, viz. an inductance branch 7–8 from the collector of the transistor and a capacitance branch 9 from the emitter of the transistor. The inductance branch comprises a large capacitor 7 for direct current blocking and an inductance 8, and the capacitance branch comprises a capacitor 9, the capacitance of which being considerably smaller than the capacitance of the capacitor 7. The two ends of the branches remote from the transistor 4 are connected to a common point P and are arranged to pass two signals with a phase difference between them of 180°. The common point of the branches is connected to one of the input terminals 2 of the transistor 4 across a resistance 10. The input terminal 2 is connected via a resistance 3 to the other input terminal 1 of the transistor 4 which is connected to the base of the transistor 4. The emitter and collector of the transistor are connected to a positive (+) and a negative (−) voltage source, via resistors 5 and 6 respectively. In parallel with the resistance 10 there is a filter link consisting of two series inductances 11 and 13 and two parallel capacitances 12 and 14. The capacitor 14 is connected between one output terminal 20 of the filter arrangement and the base of an output transistor 15. The emitter of transistor 15 is connected via a capacitor 18 to the other output terminal 19 and via a resistance 17 is connected to a positive voltage source. The collector of transistor 15 is connected via a resistance 16 to a negative voltage source.

In FIG. 2, A1 indicates in db the amplitude function of a filter arrangement with the potentials 1 and 1, 1 at the inductance 8 and the capacitor 9 respectively, at point P, while A2 indicates the corresponding amplitude function when said combination of potentials has been changed to 1 and 0. In the same figure, B1 and B2 indicate in percent the group transit time distortion for the filter arrangement according to the invention and for a conventional filter with a similar amplitude function respectively, viz. a Butterworth filter of the 4th grade in cascade with a Butterworth filter of the 3rd grade. As appears from the above, the invention provides a filter arrangement with considerably better capabilities than in earlier known conventional filters.

The filter arrangement according to FIG. 3 which is the band pass correspondence to the low pass filter in FIG. 1 with a center frequency of 70 mHz., has a link comprising an electronic valve 34, a series resonance branch 37–38 and a parallel resonance branch 39–40. The input terminals 31 and 32 of the arrangement are connected to the control grid of the electronic valve and via a resistor 35 to the cathode thereof. The series resonance branch is connected to the anode and comprises a series connection of an inductance 37 and a capacitor 38. The parallel resonance branch is connected to the cathode and comprises a parallel connection of an inductance 40 and a capacitor 39. The ends of the branches remote from the amplifier element (the electronic valve) are, as in FIG. 1, connected to a common point P. For simplicity the circuits following this point have not been shown in FIG. 3. By varying the resonance frequencies of the resonance branches the phase non-linearity of the filter arrangement may easily be adjusted. It may also be noted that the amplifier stages at the input side and at the output side of the filter arrangement impedance isolate the filter arrangement cables and/or amplifiers.

As an example the following data may be mentioned for some of the components of the arrangement according to FIG. 1.

| | | |
|---|---|---|
| Capacitor **7** | pf | 10.000 |
| Capacitor **9** | pf | 12.0 |
| Capacitor **12** | pf | 42.3 |
| Capacitor **14** | pf | 30.3 |
| Inductance **8** | μh | 2.50 |
| Inductance **11** | μh | 0.41 |
| Inductance **13** | μh | 1.60 |
| Resistor **5** | | 5Ω |
| Resistance **6** | | 5Ω |
| Resistance **10** | | 100Ω |

The corresponding components in the arrangement according to FIG. 3 have the following values.

| | | |
|---|---|---|
| Capacitor **38** | pf | 3.0 |
| Capacitor **39** | pf | 12.0 |
| Inductance **37** | μh | 2.5 |
| Inductance **40** | μh | 0.4 |
| Resistance **35** | | 5Ω |
| Resistance **41** | | 5Ω |

I claim:

1. A filter arrangement comprising an amplifier element, said amplifier element having an input terminal, an output terminal and a common terminal, said input terminal being adapted to receive a signal, a first impedance branch having first and second ends, the impedance of said first impedance branch being substantially entirely reactive, means for connecting the first of said first impedance branch to the output terminal of said amplifier element, a second impedance branch having first and second ends, the second impedance branch having an impedance which is the reciprocal of the impedance of the first impedance branch and being substantially entirely reactive, means for connecting the first end of said second impedance branch to the common terminal of said amplifier element, an output junction, and means for interconnecting the second ends of said first and second impedance branches to said output junction, the impedances of said impedance branches being chosen such the signal transmitted to said output junction via said first impedance branch is 180° out of phase with the signal transmitted to said output junction via said second impedance branch.

2. The filter arrangement of claim 1 wherein said amplifier element comprises a transistor having a base electrode as the input terminal, a collector electrode as the output terminal and an emitter electrode as the common terminal.

3. The filter arrangement of claim 1 wherein said amplifier element is a vacuum tube having a control grid as the input terminal, an anode as the output terminal and a cathode as the common terminal.

4. Filter arrangement according to claim 1, characterized thereby that one of the branches is an inductive impedance and the other branch is a capacitive impedance.

5. Filter arrangement according to claim 1, characterized thereby that one of the branches comprises a series resonance circuit and the other branch comprises a parallel resonance circuit.

References Cited

UNITED STATES PATENTS

| | | | |
|---|---|---|---|
| 2,178,012 | 10/1939 | White | 330—193 |
| 3,348,161 | 11/1967 | Ranky | 330—31 |
| 3,352,964 | 11/1967 | Hoefgeest | 330—21 |
| 3,375,456 | 3/1968 | Frisch | 330—31 |

FOREIGN PATENTS 662,790 5/1963 Canada.

JOHN KOMINSKI, Primary Examiner

U.S. Cl. X.R.

330—124, 193